(12) United States Patent
Lu et al.

(10) Patent No.: US 6,968,528 B2
(45) Date of Patent: Nov. 22, 2005

(54) PHOTO RETICLES USING CHANNEL ASSIST FEATURES

(75) Inventors: Zhijian Lu, Plano, TX (US); Kayvan Sadra, Addison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 217 days.

(21) Appl. No.: 10/406,101

(22) Filed: Apr. 2, 2003

(65) Prior Publication Data

US 2004/0197673 A1    Oct. 7, 2004

(51) Int. Cl.[7] .............................................. G06F 17/50
(52) U.S. Cl. ......................................... 716/19; 716/21
(58) Field of Search ..................................... 716/19, 21

(56) References Cited

U.S. PATENT DOCUMENTS

2004/0170905 A1    9/2004 Liebmann et al. ............. 430/5

*Primary Examiner*—Sun James Lin
(74) *Attorney, Agent, or Firm*—Peter K. McLarty; W. James Brady, III; Frederick J. Telecky, Jr.

(57) ABSTRACT

Photo reticles (110) are formed comprising a first and second printable features (130), (140) which are connected by a channel assist feature (150). The size of the channel assist feature is such that the channel assist feature will not substantially print on photoresist that is exposed using the reticle. Third printable features (120) can be placed a distance $W_D$ from the channel assist feature (150). The channel assist feature will assist in the formation of the third printable feature (120).

7 Claims, 2 Drawing Sheets

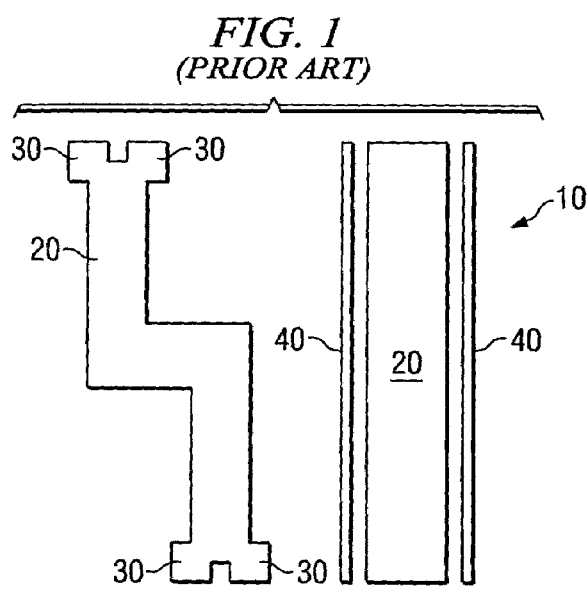
*FIG. 1*
*(PRIOR ART)*
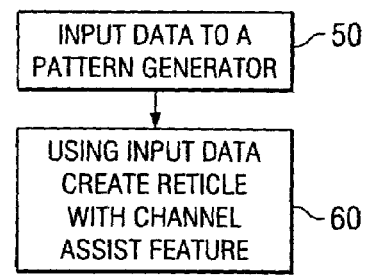
*FIG. 2*
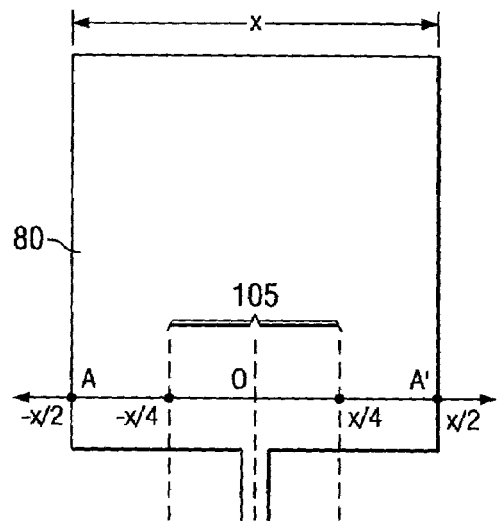
*FIG. 3*
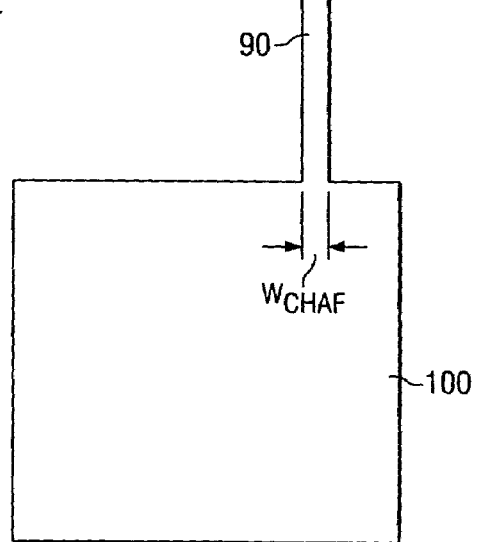

PHOTO RETICLES USING CHANNEL ASSIST FEATURES

FIELD OF THE INVENTION

This invention is generally related to the field of integrated circuit manufacturing and more specifically to a method of forming photolithographic masks using channel assist features.

BACKGROUND OF THE INVENTION

As CMOS technology continues to scale further into the sub-micron region, forming the necessary very small feature sizes on integrated circuits is becoming increasingly difficult. Optical photolithography is currently the most widely used method for patterning these very small features during the manufacture of integrated circuits. In optical photolithography a photosensitive material known as photoresist is formed and patterned over the surface of the wafer on which the integrated circuit is being formed. In the patterning process, the pattern is transferred to the photoresist by exposing the photoresist to light through a mask called a reticle. The pattern to be transferred to the photoresist is formed on the reticle and is either transparent or opaque depending on whether positive or negative photoresist is being used. In exposing the photoresist a photolithographic tool positions the reticle above the surface of the wafer and focuses light through the reticle and unto the surface of the wafer using a complex series of lens. This type of arrangement is known as a projection optical system. In optical projection systems the pattern of the reticle is much larger than the actual pattern that is formed on the surface of the wafer and the image is reduced by the lens that make up the projection optical system. In a optical projection system the pattern is transferred to a small portion of the wafer during each exposure and either the wafer, the reticle, or both the wafer and the reticle are moved following each exposure until the pattern is transferred to the entire wafer.

A number factors combine to determine the minimum feature size that can be formed using optical photolithographic techniques. These factors include the wavelength of the light used to transfer the pattern, the numerical aperture, the resist process, etc. However, the ultimate resolution is limited by diffraction effects caused when the light passes through the pattern on the reticle. For a given wavelength of light the diffraction effects are a very important limitation in obtaining very small feature sizes. Among the various diffraction effects the most important limitation to the feature size obtainable is the optical proximity effect. The individual patterns and shapes that make up the reticle do not pattern unto the photoresist independently but interact with neighboring shapes and patterns due to the diffraction effects. A key result of the optical proximity effect is that the exact size of the shapes and patterns formed on the photoresist depend on their proximity to other shapes and patterns.

A reticle typically has a complete range of line and space sizes from the densest possible packing allowed by the lithography technology and integrated circuit design rules to very sparse packing. In the sparse packing case the pattern features are typically designated as isolated. In general a pattern feature more than 5–10 times its own size from adjacent features can be considered isolated. In the case of densely packed lines the optical proximity effect will tend to limit the minimum feature size obtainable. To correct for the optical proximity effect a number of techniques such as mask biasing, the addition of serifs, and the use of assistant pattern features have used. Shown in FIG. 1 is a region of a reticle 10 containing isolated patterns 20 with the addition serifs 30 and assist pattern features 40. The serifs 30 are added to the corners of the patterns 20 to minimize the rounding and end pull-back that would otherwise occur. The assistant pattern features 40 are placed near the isolated patterns 20 to attempt to create a dense environment around the isolated lines. The assist pattern features 40 are small enough to be below the resolution of the particular optics used. As more complex integrated circuits become necessary however different shapes such as ovals are often required. Currently there is no known method of forming these shaped structures with the necessary small feature size. In addition the assist pattern features currently in use may introduce unnecessary distortion in the patterned images. There is therefore a need for a new structure that will correct for the optical proximity effect while allowing the formation of shaped structures without introducing unnecessary distortion. The instant invention addresses this need.

SUMMARY OF THE INVENTION

The instant invention describes improved photo reticles using channel assist features (CHAFs). CHAFs are formed on photo reticles by connecting printable features on a photo reticles using lines whose width is less than the minimum width that will form on the photoresist. CHAFs can also be positioned adjacent to printable features to assist in there printing.

The photo reticles are formed using a process known as pattern generation. The first step in reticle formation involves inputting data into a pattern generator. The data will define the shape, position, and size of the patterns that will comprise the reticle. The reticle comprises a transparent medium on which opaque regions are formed corresponding to the shapes to be printed on the photoresist. Following the inputting of this data a reticle is produced by the pattern generator that comprises channel assist features.

Patterns can be formed on layers during the formation of an integrated circuit by first exposing the photoresist using a photo reticle comprising channel assist features. The printable patterns are formed on the photoresist layer but the channel assist features will not form on the photoresist. The patterned photoresist layer can then be used as a mask to transfer the pattern to the underlying layer.

BRIEF DESCRIPTION OF THE DRAWINGS

In the drawings:

FIG. 1 is a cross-sectional diagram of a reticle according to the prior art

FIG. 2 is a flow chart of a method to form reticles with channel assist features according to the instant invention.

FIG. 3 is a diagram of an embodiment of the instant invention.

DETAILED DESCRIPTION OF THE INVENTION

Figure 4:
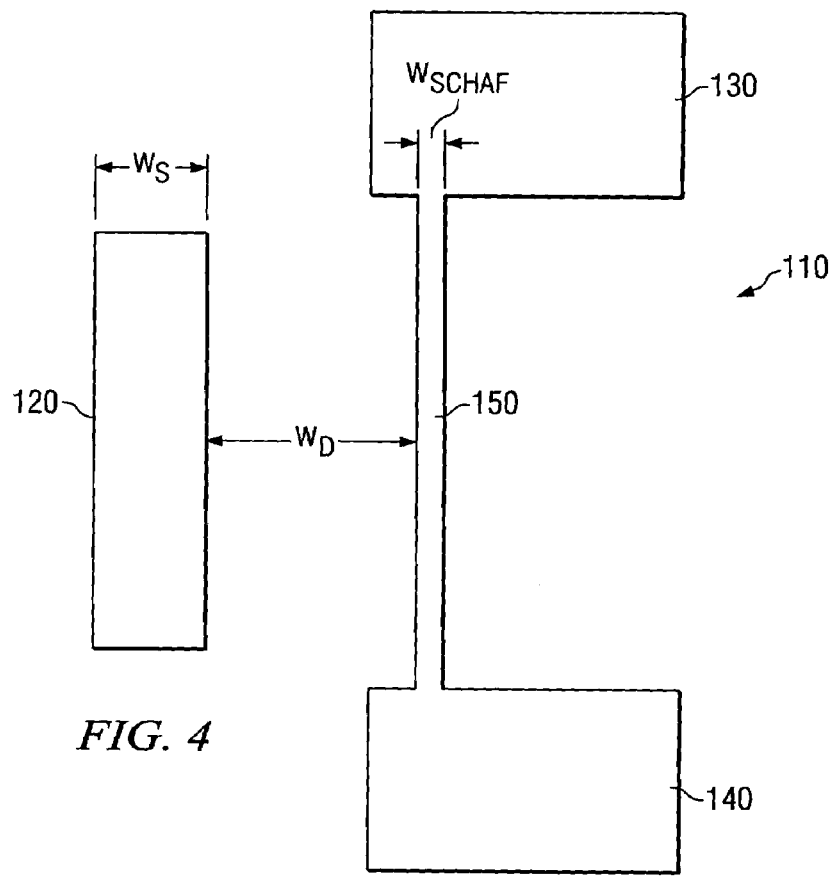
FIG. 4 is a diagram of a further embodiment of the instant invention.

Optical photolithography is performed using light of different wavelengths in the range of 157 nm and above. In forming a pattern using the optical lithography method, photoresist is exposed to light of a certain wavelength through a photo reticle (herein after referred to as reticle). Following this exposure the photoresist is placed in a developer that removes either the exposed or unexposed regions of the photoresist (depending on whether the photoresist is positive or negative) thereby transferring or printing the pattern from the reticle to the photoresist. The minimum feature size printable using optical lithography can be defined as half the minimum pitch required by the design rules. Therefore patterns on the reticle that are below a certain size will not print on the photoresist. The minimum feature size is a complex function of a number of factors including the wavelength of the light used to expose the photoresist layer through the reticle. The reticles are often referred to as photomasks or masks and the various reticles that are used to print or pattern the layers of photoresist are often referred to as masking levels.

Reticles are formed using a process known as pattern generation. Such a process is illustrated in the flow chart shown in FIG. 2. The first step in reticle formation involves inputting data into a pattern generator 50. The data will define the shape, position, and size of the patterns that will comprise the reticle. The reticle comprises a transparent medium on which opaque regions are formed corresponding to the shapes to be printed on the photoresist. It should be noted that in this case the words transparent and opaque refer to the wavelength of the light used. Transparent can be defined as a medium that allows at least 70% of the incident radiation to pass through and opaque can be defined as a region that blocks at least 70% of the incident radiation from passing through. If positive photoresist is used then the exposed regions of the photoresist become more soluble in the developer and are removed during the photoresist develop process. For negative photoresist the exposed areas become less soluble and it is the unexposed regions of photoresist that are removed during the develop process. On the reticle the determination of which regions of the reticle are transparent and which regions are opaque will be determined by whether positive or negative photoresist is used. Following the inputting of this data a reticle is produced by the pattern generator that comprises channel assist features 60. The channel assist feature (CHAF) will be described below and comprise a pattern on the reticle according to the instant invention.

The reticles formed and used in integrated circuit manufacture contain many shapes and patterns. Shown in FIG. 3 is a region of a reticle 70 containing a CHAF 90 according to an embodiment of the instant invention. The surrounding shapes and patterns are not shown for clarity. The CHAF 90 is formed between and connects two printable or main patterns 80 and 100. The patterns 80 and 100 will be printed on the photoresist and can be opaque or transparent depending on whether positive or negative photoresist is used. The pattern 80 has a width given by x and a center point o along the axis AA'. The distance from the center point o to the edge of the pattern 80 in the direction A' is given by x/2 and the distance from the center point o to the edge of the pattern 80 in the direction A is given by –x/2. As discussed earlier optical proximity effects can limit the ability to print small features in the photoresist. According to an embodiment of the instant invention, a CHAF 90 is formed connecting two printable or main patterns 80 and 100 to reduce the optical proximity effect and increase the depth of focus during the photoresist exposure process. The width of the CHAF 90 $W_{CHAF}$ must be such that the CHAF 90 does not substantially print on the photoresist. Therefore if the minimum width (or feature size) printable on the photoresist using the reticle is $W_{min}$ then the width of the CHAF is less than $W_{min}$ It should be noted that the minimum feature size or printable width is a function of the optics and the wavelength of the light used. The minimum feature size or printable width $W_{min}$ is therefore not a constant and must be considered in the context of the optics and wavelength of the light being used. In a further embodiment the width of the CHAF 90 can be limited to, $$0.25x \leq W_{CHAF} \leq 0.75x$$

where x is the width of the side of the main or printable pattern 80 to which the CHAF connected as shown in FIG. 3. In general the CHAF 90 can be positioned anywhere along the side of the main pattern 80. In a further embodiment 30 the position of the connection of the CHAF 90 to the main pattern 80 can be limited to a position between –x/4 to x/4 along the line AA' as shown by bracket 105 in FIG. 3. Limiting the connection of the CHAF 90 to the position given by 105 produces the result of extending the printed structure formed in the photoresist in a direction parallel to the direction of the CHAF 90 as it connects the main patterns 80 and 100. In this manner shaped structures such as ovals can be formed.

Shown in FIG. 4 is a further embodiment of the instant invention. A main pattern 120 of width $W_S$ is formed on a region of a reticle 110. The width $W_S$ represents the smallest dimension of the isolated main pattern 120. A CHAF 150 is formed connecting two main patterns 130 and 140 and will assist in the printing of the main pattern 120. The width $W_{SCHAF}$ of the CHAF 150 is limited to, $$0.25W_S \leq W_{SCHAF} \leq 0.75W_S$$

and must be such that the CHAF 150 does not substantially print on the photoresist. The CHAF 150 is positioned at a distance $W_D$ from the main pattern 120. The CHAF 150 must be positioned close enough to the main pattern 120 to assist in the printing of the structure. In an embodiment of the instant invention the distance $W_D$ is given by $0.7W_S \leq W_D \leq 100W_S$.

Figures 5A, 5B, 5C:
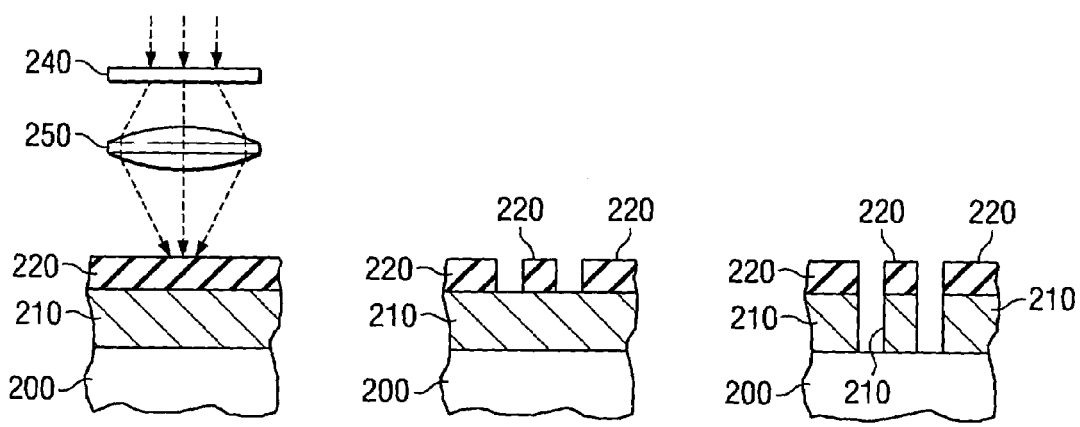
FIG. 5(*a*) to FIG. 5(*c*) are diagrams showing the patterning of a layer using a photo reticle comprising CHAFs Corresponding numerals and symbols in the different figures refer to corresponding parts unless otherwise indicated.

Shown in FIG. 5(a) is a photo reticle 240 comprising CHAFs. The reticle 240 is illuminated with light and the image contained on the photo reticle is projected unto a layer of photoresist 220 through a series of lenses 250. The symbol 250 shown in FIG. 5(a) is intended to represent the required arrangement of the necessary optics required. The photoresist layer 200 is formed over a layer 220 to be patterned. The layer 220 to be patterned can comprise any material used in the formation of integrated circuits. The layer to be patterned is formed over any number of addition layers 200 used to form the integrated circuit. As shown in FIG. 5(b), following the exposure of the photoresist layer 220, the pattern on the photo reticle is transferred to the photoresist layer 220 using known photoresist development techniques. The pattern in the photoresist 220 and then be transferred to the underlying layer 210 as shown in FIG. 5(c). The transfer of the pattern from the photoresist to the underlying layer usually involves using the patterned photoresist layer as a mask during an etching process. The instant invention should not be limited to this embodiment however and any suitable method of pattern transfer can be used. It should also be noted that the image of the CHAFs will not transfer to the photoresist during the above described process.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A photo reticle, comprising:
    a first printable feature;
    a second printable feature with a first side of width x;
    a channel assist feature connecting said first printable feature and said second printable feature wherein said channel assist feature has a width $W_{CHAF}$ given by $0.25x < W_{CHAF} < 0.75x$.

2. The photo reticle of claim 1 wherein said channel assist feature is positioned between −x/4 and x/4 from the center of the second printable feature along said first side.

3. An improved photo reticle, comprising:
    a first printable pattern;
    a second printable pattern;
    a third printable pattern of width $W_s$;
    a channel assist feature connecting said first printable pattern and second printable pattern and positioned a distance $W_D$ from said third printable pattern wherein $W_D$ is given by $0.7W_s \leq W_D \leq 100W_s$.

4. The improved photo reticle of claim 3 wherein said channel assist feature has a width that is less than minimum printable width.

5. A method for forming a photo reticle, comprising:
    entering input data into a pattern generator;
    using said input data to create a photo reticle comprising a first printable pattern, a second printable pattern of width x, and a channel assist feature connecting said first printable pattern and said second printable pattern wherein said channel assist feature has a width $W_{CHAF}$ given by $0.25x < W_{CHAF} < 0.75x$.

6. A method for forming a printable pattern on a layer, comprising:
    forming a photoresist layer over a first layer;
    exposing said photoresist layer using a photo reticle comprising said printable pattern of width x and channel assist features wherein said channel assist features have a width $W_{CHAF}$ given by $0.25x < W_{CHAF} < 0.75x$; and
    developing said exposed photoresist layer thereby transferring said printable pattern from said photo reticle to said photoresist layer.

7. The method of claim 6 further comprising using said patterned photoresist layer to transfer said printable pattern to said first layer.

* * * * *